(12) United States Patent
Tse et al.

(10) Patent No.: US 9,193,525 B2
(45) Date of Patent: Nov. 24, 2015

(54) APPARATUS FOR HANDLING ELECTRONIC COMPONENTS

(71) Applicants: Wang Lung Tse, Hong Kong (HK);
Chun Shing Wong, Kwai Chung (HK);
Ka Wing Yeung, Kwai Chung (HK);
Cho Wai Leung, Kwai Chung (HK)

(72) Inventors: Wang Lung Tse, Hong Kong (HK);
Chun Shing Wong, Kwai Chung (HK);
Ka Wing Yeung, Kwai Chung (HK);
Cho Wai Leung, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 98 days.

(21) Appl. No.: 14/205,607

(22) Filed: Mar. 12, 2014

(65) Prior Publication Data

US 2015/0259143 A1    Sep. 17, 2015

(51) Int. Cl.
*B65G 11/02* (2006.01)
*B65G 11/20* (2006.01)
*H05K 13/00* (2006.01)
*H05K 13/02* (2006.01)

(52) U.S. Cl.
CPC ............ *B65G 11/023* (2013.01); *B65G 11/203* (2013.01); *H05K 13/0015* (2013.01); *H05K 13/027* (2013.01)

(58) Field of Classification Search
CPC .. B65G 11/023; B65G 11/081; B65G 11/203; H05K 13/0015; H05K 13/027; B07C 5/344; B07C 5/362
See application file for complete search history.

(56) References Cited

U.S. PATENT DOCUMENTS

| | | | | |
|---|---|---|---|---|
| 2,947,447 A * | 8/1960 | Hazel | ............................. | 221/299 |
| 4,478,352 A * | 10/1984 | Amundson et al. | ............. | 221/13 |
| 4,647,269 A * | 3/1987 | Wedel et al. | .................. | 414/421 |
| 4,694,964 A * | 9/1987 | Ueberreiter | ..................... | 209/549 |
| 5,584,395 A * | 12/1996 | Homma | ......................... | 209/571 |
| 5,998,751 A * | 12/1999 | Brunelle | ........................ | 209/573 |
| 2014/0054244 A1 * | 2/2014 | Towers | .......................... | 210/767 |

* cited by examiner

*Primary Examiner* — Bac Au
*Assistant Examiner* — Toniae Thomas
(74) *Attorney, Agent, or Firm* — Ostrolenk Faber LLP

(57) ABSTRACT

An apparatus for handling electronic components on a lead frame. The apparatus including a singulation device configured to singulate the lead frame to thereby separate the electronic components and to position the separated electronic components alternately into at least two layers along different levels; and a guide having a plurality of lanes running along a surface of the guide, the lanes being configured to transport the separated electronic components from a first end of the guide arranged adjacent to the singulation device to a second end of the guide arranged adjacent to an output area. The lanes at the first end of the guide are alternately arranged into at least two layers having respective levels to receive the electronic components from the singulation device, whereas the lanes at the second end of the guide are arranged into a single layer along a common level for transferring the electronic components to the output area.

14 Claims, 5 Drawing Sheets

1

APPARATUS FOR HANDLING ELECTRONIC COMPONENTS

TECHNICAL FIELD

This invention relates to an apparatus for handling electronic components. It is particularly, though not exclusively, applicable to components arranged on an interdigitated lead frame.

BACKGROUND

In back-end semiconductor processing, a plurality of integrated circuit (IC) units, generally arranged in an array on a lead frame (for example, an interdigitated lead frame or IDF), is processed by separating (or singulating) the units from the lead frame and transporting the singulated units to an output means, such as a metal output tray or series of plastic tubes, for downstream operations such as testing and sorting. Typically the singulated units are handled by a pickup process involving a pitch adjusting mechanism. The pitch adjusting mechanism (which may employ a motor cam or pneumatic device, for example) is used to increase the distance between the leads of respective components so as to match the pitch of the output means.

The pitch-adjusted array of components is placed on a guide, typically a series of parallel rails, which provides a continuous guide towards the output means along a longitudinal direction. In order to move the components towards the output means it is typical to use a mover, in the form of a kicker or a pusher, to transport the components along the guide.

Known processing methods have a number of disadvantages. Transporting the singulated units to the pitch adjustment means by a pick and place process can be time-consuming. Placement of components on the rail of a guide, if not done correctly, carries a risk that components can be damaged during transport. Use of a kicker or pusher to move the components can also cause damage and therefore defects in the transported components. Further, in situations where the components are close together following singulation, such as in singulation of IDF frames, transport of the singulated components side-by-side along a guide may lead to collisions between leads of adjacent pairs of components, thereby possibly causing damage to one or both components, or resulting in leads being locked together such that the components are derailed.

The present invention seeks to at least partly overcome one or more of the above problems.

SUMMARY

Certain embodiments of the invention relate to an apparatus for handling electronic components on a lead frame, comprising:
 a singulation device configured to singulate the lead frame to thereby separate the electronic components and to position the separated electronic components alternately into at least two layers along different levels; and
 a guide having a plurality of lanes running along a surface of the guide, the lanes being configured to transport the separated electronic components from a first end of the guide arranged adjacent to the singulation device to a second end of the guide arranged adjacent to an output area,
 wherein the lanes at the first end of the guide are alternately arranged into at least two layers having respective levels to receive the electronic components from the singulation device, whereas the lanes at the second end of the guide are arranged into a same single layer along a common level for transferring the electronic components to the output area.

Other embodiments of the invention relate to a guide for an apparatus for handling electronic components on a lead frame, said apparatus comprising a singulation device configured to singulate the lead frame to thereby separate the electronic components and to position the separated electronic components alternately into two or more layers along different levels, the guide being capable of coupling to the singulation device at a first end and to an output area at a second end, the guide comprising:
 a plurality of lanes running along a surface of the guide, the lanes being configured to transport the electronic components from the first end of the guide to the second end of the guide,
 wherein the lanes at the first end of the guide are alternately arranged into at least two layers having respective levels to receive the electronic components from the singulation device, whereas the lanes at the second end of the guide are arranged into a single layer along a common level for transferring the electronic components to the output area.

BRIEF DESCRIPTION OF THE DRAWINGS

Embodiments of the invention will now be described, by way of non-limiting example only, with reference to the accompanying drawings in which.

DETAILED DESCRIPTION

Figure 1:
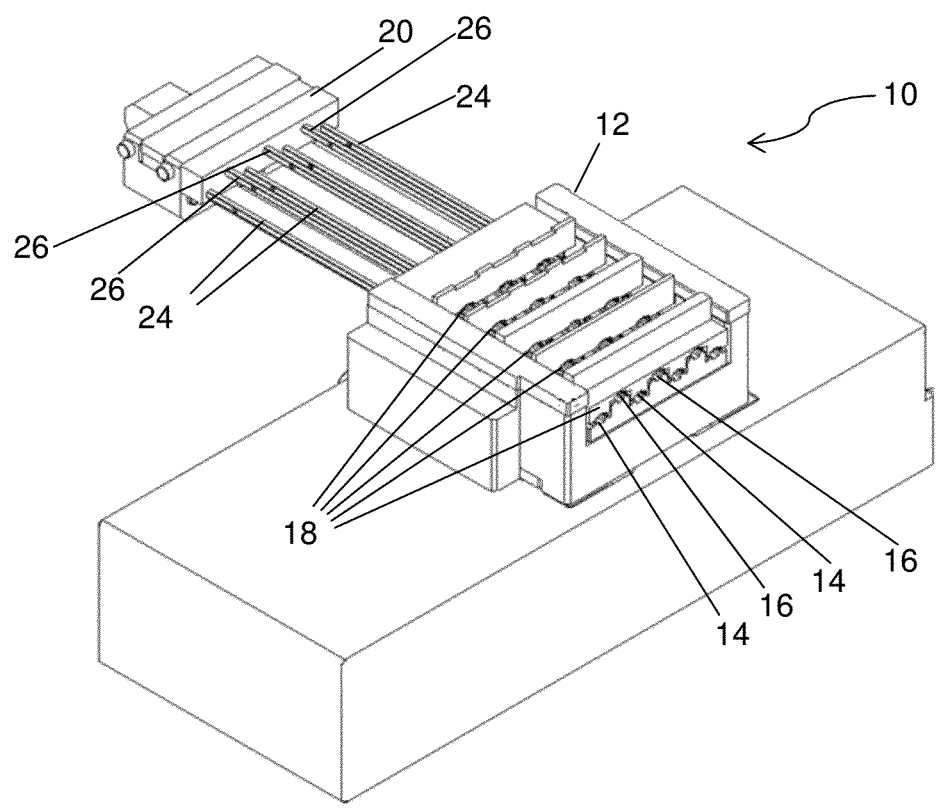
FIG. 1 is an isometric view of a singulation die set of an apparatus according to an embodiment.

Referring to FIG. 1, there is shown a singulation device 10 having a singulation die 12 with a plurality of rows 18 and columns 14, 16 to separate electronic components (semiconductor packages) on a lead frame (not shown). Each row 18 comprises alternating low-level recesses 14 and high-level recesses 16 to receive the electronic components and to position them alternately into two layers along different levels. In use, a lead frame having electronic components is positioned at the top surface of singulation die 12 and a punch descends towards the lead frame to singulate the lead frame. The electronic components that are positioned above low-level recesses 14 will be forced by the action of the punch into the low-level recesses 14, and likewise for the electronic components that are positioned above the high-level recesses 16. The effect of the height variation in the singulation die 12 is to introduce height differences between adjacent pairs of the electronic components such that two layers of components are output by the singulation device 10 along two different levels.

The singulation device 10 also includes an ejector 20 having a series of push rods for moving the singulated electronic components from the recesses 14, 16. In particular, upper rods 26 eject components from high-level recesses 16 while lower rods eject components from low-level recesses 14. When ejected from the singulation device 10, the components are pushed onto rails or lanes of the guide 30 of FIG. 2 as will now be described in more detail.

Figure 2:
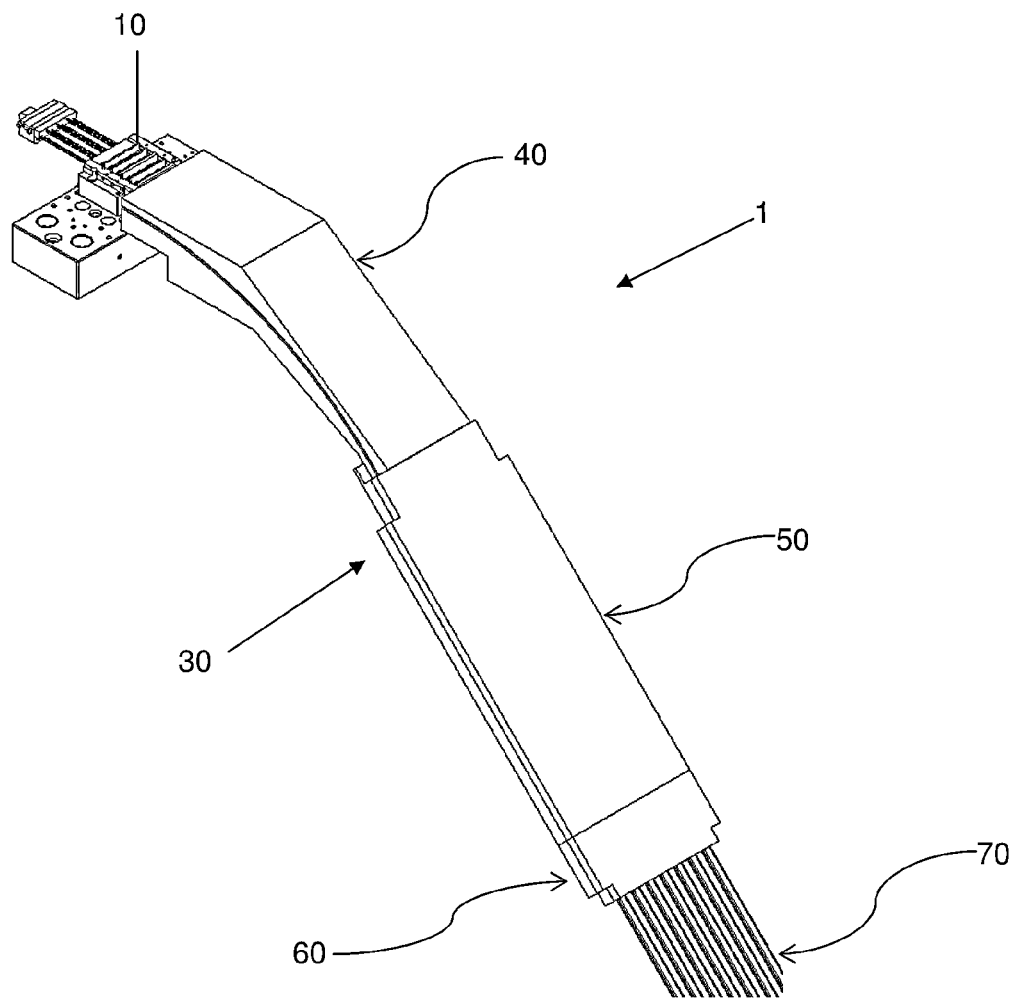
FIG. 2 shows the singulation die set of FIG. 1 coupled to a guide according to an embodiment.

Referring to FIG. 2, there is shown an apparatus 1 for handling electronic components on a lead frame, comprising the singulation device 10 coupled to a guide 30. The guide 30 comprises three main sections: a transport section 40 which is configured to couple to the singulation device 10, a pitch adjustment section 50 which is arranged after and which couples to the transport section 40, and a levelling section 60 which couples to the pitch adjustment section 50. Broadly speaking, the transport section 40 is used to convey the electronic components ejected from the singulation device 10 towards an output area 70. The pitch adjustment section 50 receives the electronic components from the transport section 40 and adjusts lateral distances between the electronic components to match the pitch of the output area 70. Finally, the levelling section 60 adjusts the relative levels of the electronic components such that they are brought to a common level when received at the output area 70 (e.g. a metal output tray to which a test handler is connected).

Figure 3A:
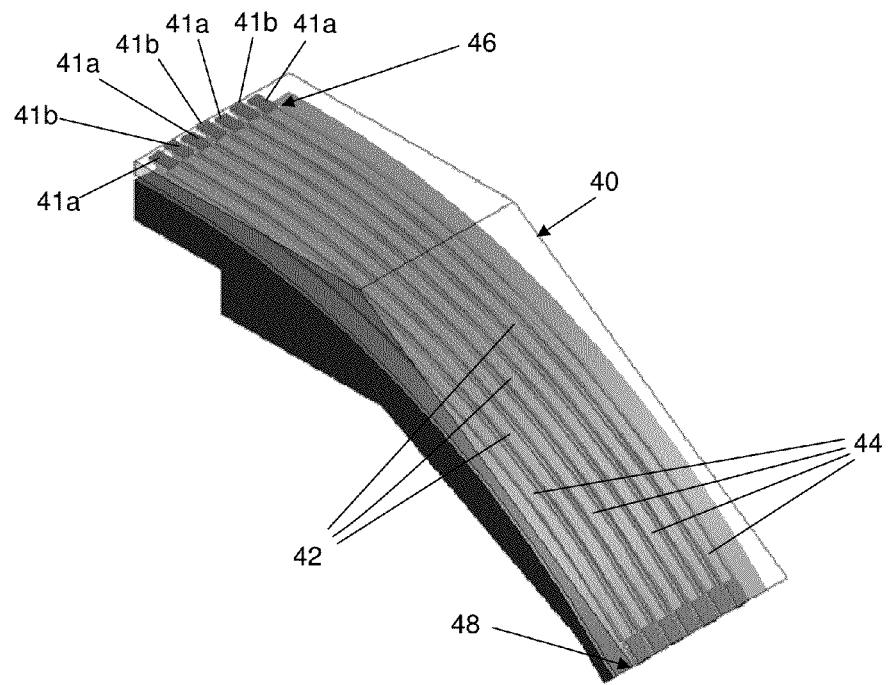
FIG. 3A is an isometric view of a transport section of the guide of FIG. 2.
Figure 3B:
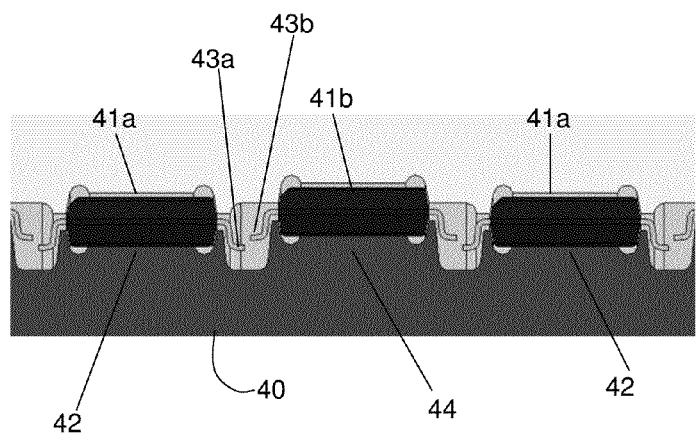
FIG. 3B is an end projection view of the transport section of FIG. 3A.

As shown in FIG. 3A and FIG. 3B, the transport section 40 comprises a plurality of lanes or rails 42, 44 which convey electronic components 41a, 41b along a downwardly curved incline. The electronic components 41a and 41b enter the transport section 40 at a first end 46 and exit at a second end 48. The incline is preferably a gradual curve following a parabolic or elliptical path, for example, but may alternatively be a linear or piecewise linear incline. The lanes 42 have a surface at a first level to receive and transport the electronic components 41a while the lanes 44, which alternate with lanes 42, have a surface at a second level, higher than the first level, to receive and transport the electronic components 41b.

The respective levels of the lanes 42 and 44 are designed to match the levels of the recesses 14 and 16 when the guide 30 is coupled to the singulation device 10, such that the electronic components ejected from the singulation device 10 smoothly transition onto the respective upper surfaces of the lanes 42 and 44. Accordingly, the electronic components can be moved onto the guide 30 without use of a pick and place mechanism or other potentially error-prone transport mechanism. Direct ejection of the electronic components from the singulation device 10 to the guide is also much quicker than pick and place, and the output (measured in units per hour or UPH) of the apparatus 1 is thereby increased. Further, due to the height differential between adjacent lanes 42 and 44 as illustrated in FIG. 3B, adjacent components 41a, 41b on the lanes 42, 44 are sufficiently spaced apart and thus, it is possible to avoid collisions between leads 43a and 43b of the electronic components 41a and 41b in the adjacent lanes.

The downward incline of the transport section 40 allows the electronic components to be transported along the guide under the influence of gravity. Since gravity is a non-contact force, the use of an incline avoids damage which might otherwise be caused to the electronic components 41a, 41b by use of a kicker or pusher. In alternative embodiments which do not have an inclined transport section 40, or which have only a very gradual incline, transport of the electronic components can be assisted or effected by an alternative non-contact means, such as a pneumatic blower (not shown).

Figure 4A:
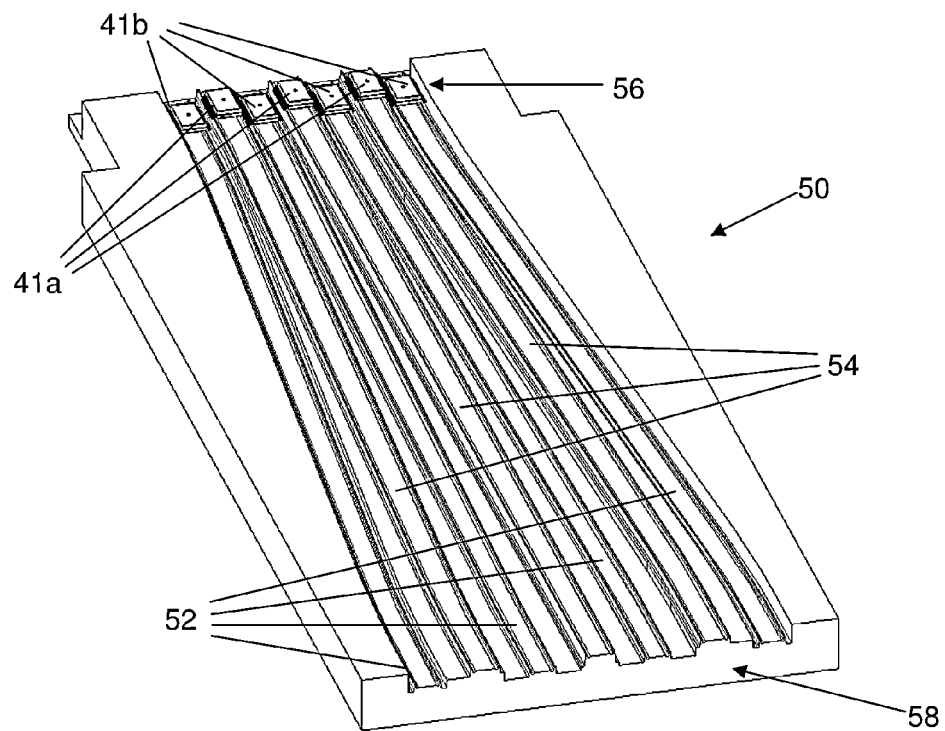
FIG. 4A is an isometric view of a pitch adjustment section of the guide of FIG. 2.
Figure 4B:
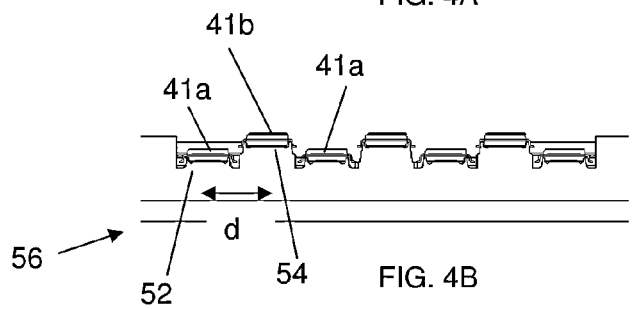
FIG. 4B and FIG. 4C are end projection views of the pitch adjustment section of FIG. 4A.
Figure 4C:
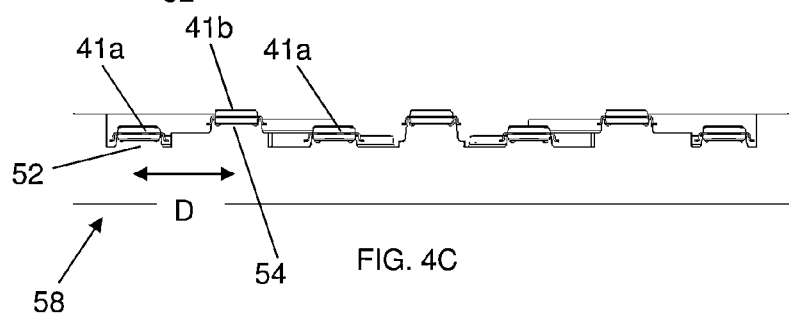

The electronic components 41a and 41b enter the first end 46 of the transport section 40 at a first pitch and at the respective first and second heights mentioned above, exit the second end 48 at the same pitch and respective heights, and as shown in FIG. 4A, subsequently enter the pitch adjustment section 50 at a first end 56, which is coupled to the second end 48 of transport section 40. At the first end 56, the lanes 52 and 54 are spaced at the same intervals as lanes 42, 44 of the transport section 40, and have upper surfaces which are at the same heights as lanes 42 and 44 such that the components transition smoothly from the transport section 40 to the pitch adjustment section 50.

The pitch adjustment section 50 comprises a plurality of lanes 52 and 54 which diverge from the first end 56 to a second end 58, but without changing height. The lanes 54 have upper surfaces which are at a greater height than the lanes 52. The width of the respective lanes 52, 54 does not itself change, but the spacing between them is modulated. Accordingly, as the electronic components 41a travel down the lanes 52 and the electronic components 41b travel down the lanes 54, the spacing between adjacent pairs of electronic components 41a and 41b increases from the initial inter-component spacing d at the first end 56 until it reaches a desired inter-component spacing D at the second end 58. Since the height differences between the lanes 52 and 54 are maintained along the length of the pitch adjustment section 50, motion of adjacent electronic components will not be interfered as the electronic components travel towards the second end 58. It will be appreciated that as the lanes 52 and 54 diverge, motion interference between the adjacent electronic components will in any case become less likely.

Figure 5A:
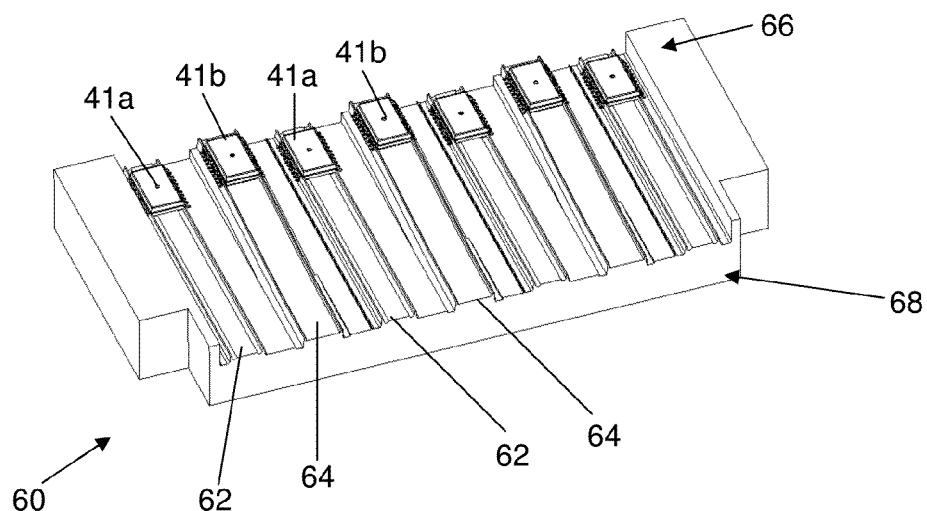
FIG. 5A is an isometric view of a level adjustment section of the guide of FIG. 2.
Figure 5B:
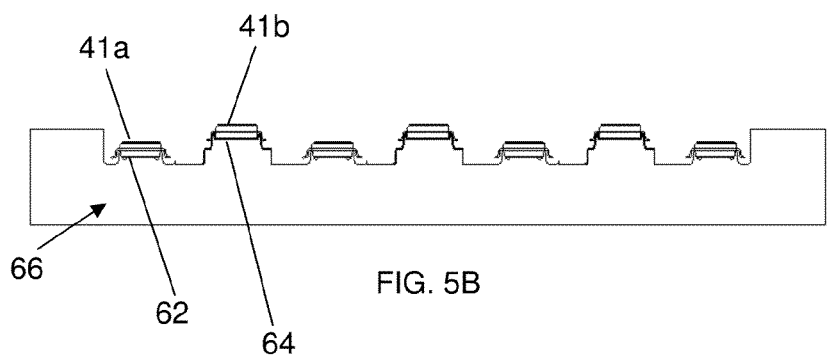
FIG. 5B and FIG. 5C are end projection views of the level adjustment section of FIG. 5A.
Figure 5C:
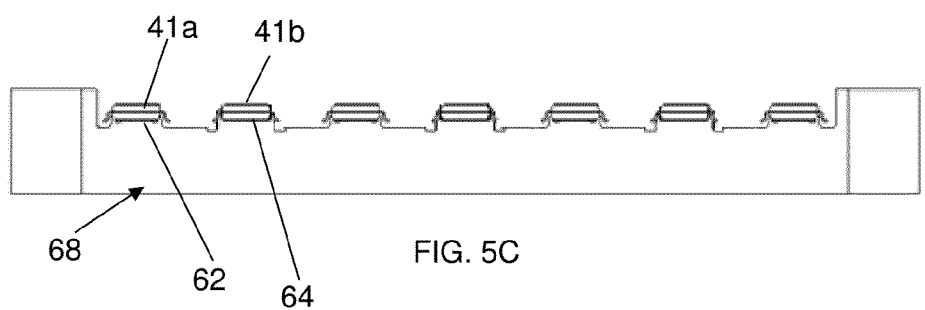

Turning now to FIG. 5A, there is shown the levelling section 60, which is coupled at a first end 66 to the second end 58 of the pitch adjustment section 50. The pitch and respective levels of the lanes 62 and 64 at the first end 66 of the levelling section 60 are the same as those at the second end 58 of the pitch adjustment section 50 such that components 41a and 41b transition smoothly to the levelling section 60. In the levelling section 60, the lanes 62 at a first level are interleaved with the lanes 64, which are at a second level having a height greater than that of the first level at the first end 66—FIG. 5B. The lanes 64 taper downwardly towards the second end 68 of the levelling section 60 such that they are at a common level with the lanes 62 at the second end, as shown in FIG. 5C. The levelling section 60 therefore ensures that all the electronic components 41a, 41b are at a single common level when they leave the guide 30, whilst having the increased pitch D imparted by pitch adjustment section 50.

The levelling section 60 of the guide 30 is coupled to the output area 70 which has a certain pitch. If an output area 70 having a different pitch is used, the pitch adjustment section 50 and levelling section 60 may be modified accordingly such that the output pitch of the guide 30 matches the different pitch of the output area 70. The output area 70 may take a number of different forms including metal trays, plastic tubes or tube pallets.

Advantageously, the apparatus 1 and the guide 30 of the present embodiments allow for high speed processing of electronic components on a lead frame, with singulated electronic components being conveyed in an in-line process directly from the singulating device to the output area, whilst minimising damage to or derailing of the electronic components being conveyed along the guide 30.

Although particular embodiments of the invention have been described in detail, many modifications and variations are possible within the scope of the invention, as will be clear to a skilled reader.

For example, while two levels of the recesses 14, 16 are shown in the singulation device 10, corresponding to the two levels in the guide 30, it would be possible to have three or more height levels if desired.

In addition, it should be appreciated that other embodiments of the guide 30 may be horizontal with respect to the ground level instead of being downwardly inclined as shown in FIG. 2, and use of a kicker or a pusher may be involved for such other embodiments of the guide 30.

Further, while the guide 30 illustrated in the Figures is shown as three separate sections coupled together, it will be appreciated that it could be a single continuous component that achieves the various functions of transferring the electronic components, adjusting the pitching of adjacent electronic components, and levelling the height of the electronic components. Forming the guide 30 as separate sections is advantageous because it allows sections to be interchanged to suit different output means, for example.

In another advantageous variant, the functions of the pitch adjustment section 50 and the levelling section 60 could be merged to form a combined pitch and level adjustment section, for example by forming the lanes 52 and 54 which diverge as shown in FIG. 4A, but modifying the lanes 54 such that they also taper downwardly from the first end 56 to the second end 58, in similar fashion to the lanes 64 of FIG. 5A. By forming a section which simultaneously adjusts the pitch and height of the components travelling along it, the footprint of the guide 30 can be reduced.

In a further variant, the transport section 40 may be omitted, such that the singulated electronic components 41a and 41b directly enter the pitch adjustment section 50 (or a combined pitch and levelling section as described above) from the singulation device 10.

The invention claimed is:

1. An apparatus for handling electronic components on a lead frame, comprising:
    a singulation device configured to singulate the lead frame to thereby separate the electronic components and to position the separated electronic components alternately into at least two layers along different levels; and
    a guide having a plurality of lanes running along a surface of the guide, the lanes being configured to transport the separated electronic components from a first end of the guide arranged adjacent to the singulation device to a second end of the guide arranged adjacent to an output area,
    wherein the lanes at the first end of the guide are alternately arranged into at least two layers having respective levels to receive the electronic components from the singulation device, whereas the lanes at the second end of the guide are arranged into a single layer along a common level for transferring the electronic components to the output area.

2. The apparatus of claim 1, wherein the guide further comprises:
    a pitch adjustment section for adjusting lateral distances between the electronic components that are adjacent in the lanes to a desired lateral distance; and
    a levelling section for adjusting relative levels of the electronic components to the common level.

3. An apparatus according to claim 2, wherein the guide further comprises a transport section arranged before the pitch adjustment section.

4. An apparatus according to claim 3, wherein the transport section comprises at least one inclined section such that the electronic components are movable along the transport section at least partly under the influence of gravity.

5. An apparatus according to claim 1, further comprising a pneumatic blower for moving the electronic components along the guide.

6. An apparatus according to claim 2, wherein the lanes running along the pitch adjustment section diverge to increase the lateral distances between the electronic components.

7. An apparatus according to claim 2, wherein the levelling section comprises first lanes configured to receive the electronic components along a first level, and second lanes configured to receive the electronic components along one or more levels that are different from the first level, said second lanes each having a downward incline terminating along the first level.

8. An apparatus according to claim 2, wherein the pitch adjustment section is separate from the level adjustment section.

9. A guide for an apparatus for handling electronic components on a lead frame, said apparatus comprising a singulation device configured to singulate the lead frame to thereby separate the electronic components and to position the separated electronic components alternately into two or more layers along different levels, the guide being capable of coupling to the singulation device at a first end and to an output area at a second end, the guide comprising:
    a plurality of lanes running along a surface of the guide, the lanes being configured to transport the electronic components from the first end of the guide to the second end of the guide,
    wherein the lanes at the first end of the guide are alternately arranged into at least two layers having respective levels to receive the electronic components from the singulation device, whereas the lanes at the second end of the guide are arranged into a single layer along a common level for transferring the electronic components to the output area.

10. The guide according to claim 9, further comprising
    a pitch adjustment section for adjusting lateral distances between the electronic components; and
    a levelling section for adjusting relative levels of the electronic components to the common level.

11. A guide according to claim 10, further comprising a transport section arranged before the pitch adjustment section.

12. A guide according to claim 11, wherein the transport section comprises at least one inclined section such that the electronic components are movable along the transport section at least partly under the influence of gravity.

13. A guide according to claim 10, wherein the levelling section comprises first lanes configured to receive the electronic components along a first level, and second lanes configured to receive the electronic components along one or more levels that are different from the first level, said second lanes each having a downward incline terminating at the first level.

14. A guide according to claim 10, wherein the pitch adjustment section is separate from the level adjustment section.

* * * * *